United States Patent
Lin et al.

(10) Patent No.: US 6,835,578 B1
(45) Date of Patent: Dec. 28, 2004

(54) TEST STRUCTURE FOR DIFFERENTIATING THE LINE AND VIA CONTRIBUTION IN STRESS MIGRATION

(75) Inventors: Li-Te S. Lin, Hsinchu (TW); Chin-Chiu Hsia, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/672,410

(22) Filed: Sep. 26, 2003

(51) Int. Cl.⁷ .............................................. H01L 21/66
(52) U.S. Cl. ........................... 438/14; 438/6; 438/10; 438/17; 438/48; 438/50; 438/54
(58) Field of Search ............................... 438/14, 6, 10, 438/17, 48, 50, 54

(56) References Cited

U.S. PATENT DOCUMENTS

| | | | |
|---|---|---|---|
| 5,554,938 A | * | 9/1996 | Ohmi ........................... 324/693 |
| 5,930,587 A | | 7/1999 | Ryan ............................ 438/14 |
| 6,004,827 A | | 12/1999 | Ryan ............................ 438/6 |
| 6,342,733 B1 | | 1/2002 | Hu et al. ...................... 257/750 |

* cited by examiner

Primary Examiner—Matthew Smith
Assistant Examiner—Victor V. Yevsikov
(74) Attorney, Agent, or Firm—Haynes and Boone, LLP

(57) ABSTRACT

A method of measuring the stress migration of vias, and a the structure, the method comprising the following steps. A metal line having a middle and opposing first and second ends is formed. First and second opposing pads electrically connected to the respective opposing first and second ends of the metal line through respective first and second step-width line structures are formed. A third pad connected to the metal line proximate its first end by a first via through a first metal structure is formed. A fourth pad connected to the metal line proximate its second end by a second via through a second metal structure is formed. The first and second vias are equidistant from the respective first and second ends of the metal line. The stress migration of the first via is determined by measuring the: sheet resistance between the first pad and the third pad; and/or the stress migration of the second via is determined by measuring the sheet resistance between the fourth pad and the second pad.

32 Claims, 1 Drawing Sheet

TEST STRUCTURE FOR DIFFERENTIATING THE LINE AND VIA CONTRIBUTION IN STRESS MIGRATION

BACKGROUND OF THE INVENTION

Stress migration becomes a crucial issue for copper (Cu)/low dielectric constant (low-k) interconnects where a low dielectric constant is less than about 3.0. The usual test structures, such as pull-back (small lower metal with a large top metal), hump (large lower metal with a small top metal) patterns and landed electromigration (EM) patterns, etc., can only give a combination of the line and via resistance shift post stress.

The current best practice is to set up a set of line patterns with the dimensions as close as those in the typical stress migration (SM) patterns. However the result still varies depending upon the position on the wafer and the local pattern density near the test patterns.

U.S. Pat. No. 6,342,733 B1 to Hu et al. describes a test structure for EM and SM.

U.S. Pat. No. 6,004,827 to Ryan describes various test structures with aluminum runners and overlying dielectrics.

U.S. Pat. No. 5,930,587 to Ryan describes an SM method and test structure.

SUMMARY OF THE INVENTION

Accordingly, it is an object of one or more embodiments of the present invention to provide an improved stress migration test structure and stress migration method used to measure and differentiate between line stress migration and via stress migration.

Other objects will appear hereinafter.

It has now been discovered that the above and other objects of the present invention may be accomplished in the following manner. Specifically, a metal line having a middle and opposing first and second ends is formed. First and second opposing pads electrically connected to the respective opposing first and second ends of the metal line through respective first and second step-width line structures are formed. A third pad connected to the metal line proximate its first end by a first via through a first metal structure is formed. A fourth pad connected to the metal line proximate its second end by a second via through a second metal structure is formed. The first and second vias are equidistant from the respective first and second ends of the metal line. The stress migration of the first via is determined by measuring the: sheet resistance between the first pad and the third pad; and/or the stress migration of the second via is determined by measuring the sheet resistance between the fourth pad and the second pad. And the test pattern structure thereof.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
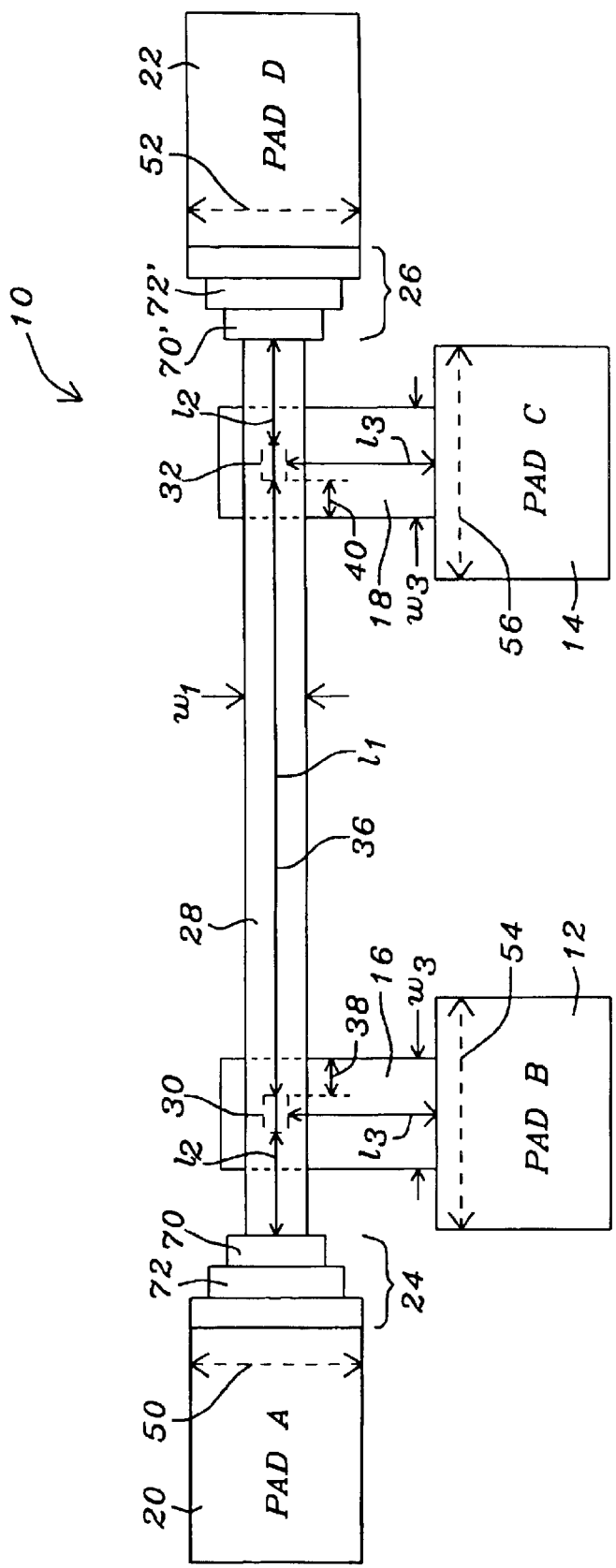
FIG. 1 schematically illustrates a preferred embodiment of the present invention.

FIG. 1 is a top down, plan view of the test pattern structure 10 of the present invention that is positioned upon a wafer to be tested.

Pad A 20 for Rs (sheet resistance of metal line 28) is connected to Pad D 22 for Rs (sheet resistance of metal line 28) by metal line 28 through respective step-width line structures 24, 26. The step-width line structures 24, 26 each have a greatest width proximate respective Pads A 20, D 22 and a smallest width proximate metal line 28 and are used to prevent extra "two-dimensional effect" (2D effect).

The "2D effect" is when a narrow metal lead is connected to a wide metal. All vacancies in the wide metal will be driven to the narrow metal due to stress gradient. By using a step-case type connection such as in the present invention, e.g. ½ reduction in each step, one might reduce the stress gradient and reduce this effect.

Metal line 28 has a width $w_1$ that is preferably one rule wide. While there is no definite dimension assigned for the test structure of the present invention, one should perform a dimension split for certain technologies to study the design rule.

Pad A/Pad D widths 50/52 are preferably from about 50 to 75% wider than metal line 28 width $w_1$.

Pad B 12 for stress migration (SM) of via 30 is connected to metal line 28 by via 30 through metal structure 16 and Pad C 14 for stress migration (SM) of via 32 is connected to metal line 28 by via 32 through metal structure 18.

Pads B and C are in the same plane and Pads A and D are in the same plane (as they will connect to the top most pads for electrical probing) while metal line 28 is in a different plane from metal structures 16, 18. For example, as shown in FIG. 1, metal structures 16, 18 are in a lower plane than metal line 28 and as such metal structures 16, 18 may be M1 metal layers while metal line 28 may be an M2 metal layer.

This test structure is for interconnect reliability test. The metal lines and holes can be copper (Cu) or an aluminum copper alloy (AlCu). The filling space can be oxide, silicon oxide or another low-k dielectric material. Mainly, this structure is for Cu/low-k material interconnects.

Thus, pads A 20, D 22, B 12, C 14 are preferably comprised of Cu or AlCu; step-width line structures 24, 26 are each preferably comprised of Cu or AlCu and are more preferably copper; metal line 28 and metal structures 16, 18 are each preferably comprised of Cu or AlCu and more preferably copper.

As shown in FIG. 1, respective vias 30, 32 have a distance:

$l_1$ from each other of preferably longer than specific Cu system's Blech Length (it's preferably a copper (Cu) system (grain, stress, dimension, Max force constant density) dependent and is typically greater than 200 to 300 μm)/width $w_1$ should cover the three range of widths, bamboo or bamboo-like polycrystalline since these various crystalline behavior will affect the performance of the system, these width for the three ranges again is system dependent, typical range would be <0.25 μm, 0.5 μm, >1.0 μm.;

$l_2$ from step-width line structures 24, 26; and $l_3$ from Pads B, C.

Preferably:

$l_1 \gg l_2, l_3$; and $w_3 \gg w_1$ although the present invention is not limited to these relationships.

One may split various dimension combinations of $l_1$, $l_2$ and $l_3$ for the design rule study.

The width of metal line 28 is usually on-rule, i.e. the smallest dimension of the technology, and $w_3$ may split for a large range.

The width $w_3$ of each metal structure 16, 18 is preferably wider than the width $w_1$ of metal line 28, the on-rule metal line (see above).

As noted above, $w_3 > w_1$ (for upper metal of hump-type) is used for stress migration (SM) test with a larger lower metal and $w_3 < w_1$ is used with a larger upper metal (for pull-back type).

Although the instant invention employs four pads A 20, B 12, C 14, D 22, only two probes (not shown) are contacted to two of the four Pads A 20, B 12, C 14, D 22 to measure the selected parameter, i.e., e.g.:

I. Pad A-D: Line $Rs = R_{AD}$ ($\Omega$ (ohm) /square);

II. Pad A-B (or C-D): Single-via 30 (or 32) $SM = R_{AB}$ (or $R_{CD}$) ($\Omega$);

III. Pad B-C: Dual-via 30, 32 $SM = R_{BC}$ ($\Omega$); and

IV. If $w_3 \gg w_1$, then:

Via 30, 32 $Rc = R_{AB}$ (or $R_{CD}$)−$(R_{AD}*l_2$ (number of squares)), or

Via 30, 32 $Rc = (R_{BC} - (R_{AD}*l_2))/2$

The total sheet resistance of metal line 28 is:

$R_{AD} = Rs_{AD}*(l_1 + 2l_2)$ (number of squares on the metal line)

For example, the total resistance of the test pattern from:

Pad A to Pad B is $R_{AB} = Rs_{AD}*l_2 + Rc$ (30);

Pad C to Pad D is $R_{CD} = Rs_{AD}*l_2 + Rc$ (30); and

Pad B to Pad C is $R_{BC} = Rs_{AD}*(l_1 + 2Rc(30+32)$ when $w_3 > 22 w_1$ and where $l_1$ and $l_2$ are in number of squares. If $w_3$ is not $> 22 w_1$ then $l_3$ in number of squares must be added to $l_2$ at each instance.

The test pattern structure 10 formed in accordance with the instant invention may be used to, for example:

(A) dimension split for rule check (can create design rule)—some examples are:
1) metal dimension ($w_3 \times l_3$) connect to via or necessary to implement dual via structure; and
2) critical metal length at w1 line;

(B) process optimization with high sensitivity chain structure—use 10, 500 or much more units to test the yield since the failure rate will increase with more units;

(C) study 3D stress migration effect—i.e. where a via is pulled back in stress migration (SM) and a void causes an open failure; and (D) can determine the contribution from lines or vias—by previous calculation (see above), the line and via resistance can be differentiated so the contribution of resistance shift by stress migration (SM) can be identified as coming from metal lines or vias; and (E) can be used for process optimization in advanced process development and design rule setup for interconnects.

If one knew the contribution from the line or via, one may optimize the trench process or via process respectively. This is the point of process optimization.

Advantages of the Present Invention

The advantages of one or more embodiments of the present invention include:

1. the conventional stress migration (SM) resistance shift can be measured with both line and via resistance by Pads A, D; and 2. by using different line dimensions, the Rs contribution from the upper or lower metal line can be determined in a more realistic way so that the component of resistance shift is differentiated.

While particular embodiments of the present invention have been illustrated and described, it is not intended to limit the invention, except as defined by the following claims.

We claim:

1. A method of measuring the stress migration of vias, comprising the steps of:

forming a metal line having a middle and opposing first and second ends;

forming first and second opposing pads electrically connected to the respective opposing first and second ends of the metal line through respective first and second step-width line structures;

forming a third pad connected to the metal line proximate its first end by a first via through a first metal structure;

forming a fourth pad connected to the metal line proximate its second end by a second via through a second metal structure; the first and second vias being equidistant from the respective first and second ends of the metal line; and measuring the stress migration of the first via by measuring the sheet resistance between the first pad and the third pad; and/or measuring the stress migration of the second via by measuring the sheet resistance between the fourth pad and the second pad.

2. The method of claim 1, wherein the metal line, the first and second step-width line structures and the first and second metal structures being comprised of copper or an aluminum copper alloy.

3. The method of claim 1, wherein the metal line, the first and second step-width line structures and the first and second metal structures being comprised of copper.

4. The method of claim 1, wherein the first, second, third and fourth pads are comprised of copper or an aluminum copper alloy.

5. The method of claim 1, wherein the first, second, third and fourth pads are comprised of copper.

6. The method of claim 1, wherein the metal line 28 has a width $w_1$ that is one rule wide.

7. The method of claim 1, wherein the first and second pads each have a width and the metal line has a width $w_1$ with the width of the first and second pads being from about 50 to 75% larger than the width $w_1$ of the metal line.

8. The method of claim 1, wherein the first and second pads are in a first common plane; and the third and fourth pads are in a second common plane.

9. The method of claim 1, wherein the first, second, third and fourth pads are in a common plane.

10. A method of measuring the stress migration of vias, comprising the steps of:

forming a metal line having a middle and opposing first and second ends;

forming first and second opposing pads electrically connected to the respective opposing first and second ends of the metal line through respective first and second step-width line structures;

forming a third pad connected to the metal line proximate its first end by a first via through a first metal structure;

forming a fourth pad connected to the metal line proximate its second end by a second via through a second metal structure; the first and second vias being equidistant from the respective first and second ends of the metal line; and measuring the stress migration of the first via by measuring the sheet resistance between the first pad and the third pad; and/or measuring the stress migration of the second via by measuring the sheet resistance between the fourth pad and the second pad;

wherein the metal line, the first and second step-width line structures and the first and second metal structures being comprised of copper or an aluminum copper alloy.

11. The method of claim 10, wherein the metal line, the first and second step-width line structures and the first and second metal structures being comprised of copper.

12. The method of claim 10, wherein the first, second, third and fourth pads are comprised of copper or an aluminum copper alloy.

13. The method of claim 10, wherein the first, second, third and fourth pads are comprised of copper.

14. The method of claim 10, wherein the metal line 28 has a width $w_1$ that is one rule wide.

15. The method of claim 10, wherein the first and second pads each have a width and the metal line has a width $w_1$ with the width of the first and second pads being from about 50 to 75% larger than the width $w_1$ of the metal line.

16. The method of claim 10, wherein the first and second pads are in a first common plane; and the third and fourth pads are in a second common plane.

17. The method of claim 10, wherein the first, second, third and fourth pads are in a common plane.

18. A test pattern structure, comprising:

a metal line having a middle and opposing first and second ends;

first and second opposing pads electrically connected to the respective opposing first and second ends of the metal line through respective first and second step-width line structures;

a third pad connected to the metal line proximate its first end by a first via through a first metal structure; and a fourth pad connected to the metal line proximate its second end by a second via through a second metal structure; the first and second vias being equidistant from the respective first and second ends of the metal line.

19. The structure of claim 18, wherein the metal line, the first and second step-width line structures and the first and second metal structures are comprised of copper.

20. The structure of claim 18, wherein the first, second, third and fourth pads are comprised of copper or an aluminum copper alloy.

21. The structure of claim 18, wherein the first, second, third and fourth pads are comprised of copper.

22. The structure of claim 18, wherein the metal line has a width $w_1$ that is one rule wide.

23. The structure of claim 18, wherein the first and second pads each have a width and the metal line has a width $w_1$ with the width of the first and second pads being from about 50 to 75% larger than the width $w_1$ of the metal line.

24. The structure of claim 18, wherein the first and second pads are in a first common plane; and the third and fourth pads are in a second common plane.

25. The structure of claim 18, wherein the first, second, third and fourth pads are in a common plane.

26. A test pattern structure, comprising:

a metal line having a middle and opposing first and second ends;

first and second opposing pads electrically connected to the respective opposing first and second ends of the metal line through respective first and second step-width line structures; the first and second pads being in a first common plane;

a third pad connected to the metal line proximate its first end by a first via through a first metal structure; and a fourth pad connected to the metal line proximate its second end by a second via through a second metal structure; the first and second vias being equidistant from the respective first and second ends of the metal line; the third and fourth pads being in a second common plane.

27. The structure of claim 26, wherein the metal line, the first and second step-width line structures and the first and second metal structures are comprised of copper.

28. The structure of claim 26, wherein the first, second, third and fourth pads are comprised of copper or an aluminum copper alloy.

29. The structure of claim 26, wherein the first, second, third and fourth pads are comprised of copper.

30. The structure of claim 26, wherein the metal line has a width $w_1$ that is one rule wide.

31. The structure of claim 26, wherein the first and second pads each have a width and the metal line has a width $w_1$ with the width of the first and second pads being from about 50 to 75% larger than the width $w_1$ of the metal line.

32. The structure of claim 26, wherein the first, second, third and fourth pads are in a common plane.

\* \* \* \* \*

UNITED STATES PATENT AND TRADEMARK OFFICE
CERTIFICATE OF CORRECTION

PATENT NO.    : 6,835,578 B1
DATED         : December 28, 2004
INVENTOR(S)   : Li-Te S. Lin et al.

It is certified that error appears in the above-identified patent and that said Letters Patent is hereby corrected as shown below:

Column 1,
Line 5, insert -- FIELD OF THE INVENTION
    The present invention relates generally to semiconductor fabrication and more specifically to test structures used to determine stress migration. --

Signed and Sealed this

Twelfth Day of July, 2005

JON W. DUDAS
*Director of the United States Patent and Trademark Office*